(12) United States Patent
Kuo et al.

(10) Patent No.: US 9,779,942 B1
(45) Date of Patent: Oct. 3, 2017

(54) METHOD OF FORMING PATTERNED MASK LAYER

(71) Applicant: UNITED MICROELECTRONICS CORP., Hsin-Chu (TW)

(72) Inventors: Chih-Wei Kuo, Tainan (TW); Yu-Tsung Lai, Tainan (TW); Jiunn-Hsiung Liao, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/220,386

(22) Filed: Jul. 26, 2016

(51) Int. Cl.
  *H01L 21/033* (2006.01)
  *H01L 21/311* (2006.01)

(52) U.S. Cl.
  CPC ...... *H01L 21/0337* (2013.01); *H01L 21/0338* (2013.01); *H01L 21/31144* (2013.01)

(58) Field of Classification Search
  CPC ............ H01L 21/0337; H01L 21/0338; H01L 21/31144; H01L 21/76804; H01L 21/28123; H01L 21/3086; H01L 21/31138; H01L 21/32139; G03F 7/40
  USPC ........................................................ 438/699
  See application file for complete search history.

(56) References Cited

U.S. PATENT DOCUMENTS

| 8,486,610 | B2 | 7/2013 | Abatchev |
| 8,623,770 | B1 | 1/2014 | Gao |
| 8,980,701 | B1 | 3/2015 | Lu |
| 2003/0059958 | A1* | 3/2003 | Drewes ................ B82Y 10/00 438/3 |
| 2013/0011987 | A1* | 1/2013 | Park ................ H01L 27/10876 438/381 |

* cited by examiner

*Primary Examiner* — Caleen Sullivan
(74) *Attorney, Agent, or Firm* — Winston Hsu

(57) ABSTRACT

A method of forming a patterned mask layer includes the following steps. A plurality of support features is formed on a mask layer. A plurality of spacers is formed on side walls of the support features. A patterned protection layer is formed on the support features and top surfaces of the spacers. At least a part of side surfaces of the spacers are not covered by the patterned protection layer, and the patterned protection layer is formed in a process environment containing methane ($CH_4$). A trimming process is then performed to remove a part of each of the spacers. Tapered parts of the spacers may be removed by the trimming process before the step of etching the mask layer with the spacers as a mask, and the critical dimension uniformity of the patterned mask layer may be improved accordingly.

15 Claims, 6 Drawing Sheets

METHOD OF FORMING PATTERNED MASK LAYER

BACKGROUND OF THE INVENTION

1. Field of the Invention

The present invention relates to a method of forming a patterned mask layer, and more particularly, to a method of forming a patterned mask layer by a multiple patterning approach.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. However, photolithography technology is used to form patterned structures in general semiconductor manufacturing processes. The size and the spacing between the patterned structures are limited by the exposure resolution minimum of the photolithography technology and hard to be further shrunk, and that becomes a bottleneck issue of the semiconductor technology. The sidewall image transfer (SIT) technology has be provided by the related industries for transferring patterns of the sidewall with size smaller than the exposure resolution minimum of the photolithography technology.

Please refer to FIGS. 1-3. FIGS. 1-3 are schematic drawings illustrating a conventional method of patterning a mask layer. As shown in FIGS. 1-3, sidewall spacers 92S are used as a mask for patterning a mask layer 90, and the patterned mask layer may be used to form patterned structures such as trenches and fin structures. As shown in FIG. 1 and FIG. 2, the sidewall spacers 92 are formed by performing an etching back process to a spacer material layer 92 conformally formed on the mask layer 90 and mandrels 91 on the mask layer 90. The sidewall spacer 92 has a taper part 92F especially when the distance between two adjacent mandrels is extremely small. As shown in FIG. 2 and FIG. 3, the mandrels 91 are removed after the step of forming the sidewall spacers 92S, and apart of the mask layer 90, which is not covered by the sidewall spacers 92S and the mandrels 91, will be damaged by an etching process for removing the mandrels 91 because of the taper parts 92F of the sidewall spacers 92S. Therefore, the shape of the patterned mask layer formed by etching the mask layer 90 with the sidewall spacers 92S as a mask will not be uniform, and uniformity of the critical dimension and/or the depth of patterned formed by using the patterned mask layer as a mask will be affected accordingly.

SUMMARY OF THE INVENTION

According to an embodiment of the present invention, a method of forming a patterned mask layer is provided. The method includes the following steps. A plurality of spacers is formed on side walls of the support features. A patterned protection layer is formed on the support features and top surfaces of the spacers. At least a part of side surfaces of the spacers are not covered by the patterned protection layer, and the patterned protection layer is formed in a process environment containing methane ($CH_4$). A trimming process is then performed to remove a part of each of the spacers.

According to the method of forming the patterned mask layer in the present invention, a part of each of the spacers is removed by the trimming process with the patterned protection layer formed on the top surfaces of the spacers. Tapered parts of the spacers may be removed by the trimming process before the step of etching the mask layer with the spacers as a mask. The critical dimension uniformity of the patterned mask layer may be improved accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-3 are schematic drawings illustrating a conventional method of patterning a mask layer, wherein FIG. 2 is a schematic drawing in a step subsequent to FIG. 1, and FIG. 3 is a schematic drawing in a step subsequent to FIG. 2.

FIGS. 4-12 are schematic drawings illustrating a method of forming a patterned mask layer according to an embodiment of the present invention, wherein FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, and FIG. 12 is a schematic drawing in a step subsequent to FIG. 11.

DETAILED DESCRIPTION

Figure 1:
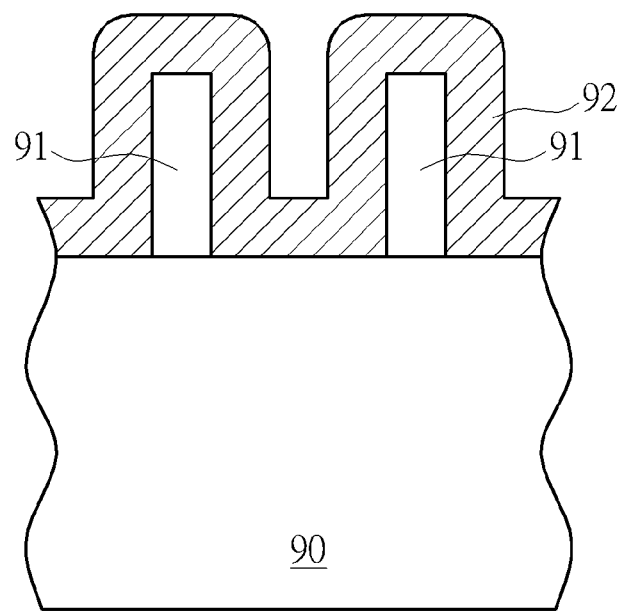
Figure 2:
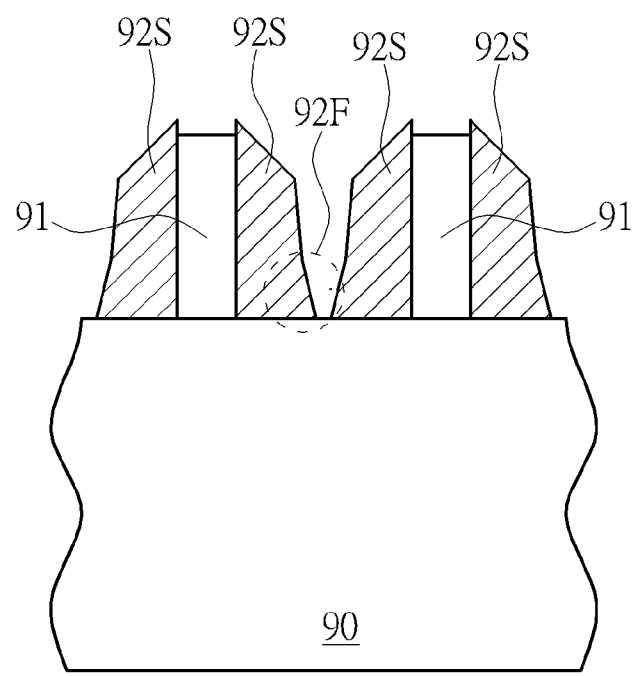
Figure 3:
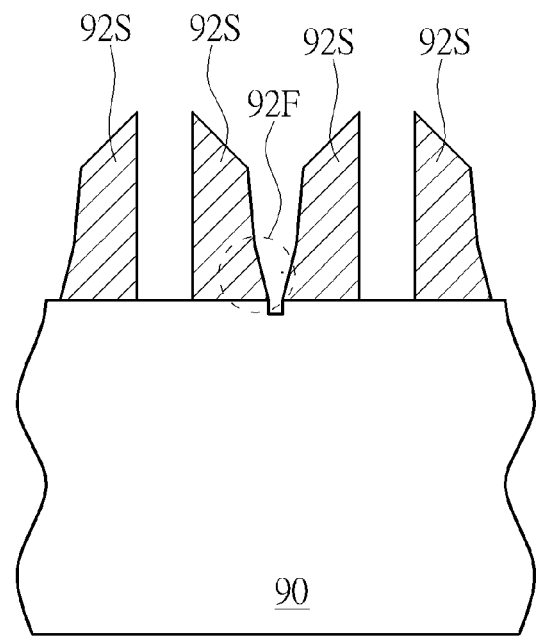
Figure 4:
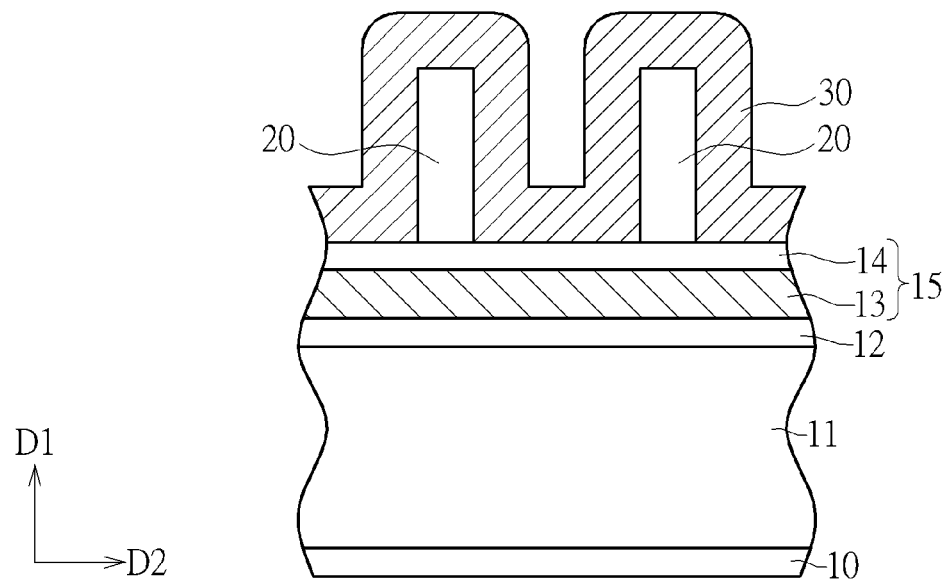

Please refer to FIGS. 4-12. FIGS. 4-12 are schematic drawings illustrating a method of forming a patterned mask layer according to an embodiment of the present invention. The method of forming the patterned mask layer in this embodiment includes the following steps. As shown in FIG. 4, a mask layer 15 is provided. The mask layer 15 may be formed on a semiconductor substrate (not shown), and the semiconductor substrate may include silicon substrate, epitaxial substrate, silicon carbide substrate, or silicon-on-insulator (SOI) substrate, but not limited thereto. A standard metal-oxide semiconductor (MOS) transistor process may be performed to form at least one MOS transistor (not shown) or other semiconductor devices on the semiconductor substrate before the step of forming the mask layer 15, but the present invention is not limited to this. In another embodiment of the present invention, the mask layer 15 may be formed before or during the processes of forming the MOS transistor. Specifically, the patterned mask layer in this embodiment may be used to form trenches in the processes of BEOL (back-end of line), and the patterned mask layer in some embodiments of the present invention may also be used in the processes of FEOL (front-end of line), such as the process of forming fin structures. The MOS transistor could be a PMOS transistor, a NMOS transistor, or a CMOS transistor, and the MOS transistor could also include typical transistor structures including a gate structure, a spacer, a lightly doped drain, source/drain regions and/or salicides. The gate structure may be a polysilicon gate or a metal gate formed by high-k first or high-k last processes.

In this embodiment, an etching stop layer 10, an inter metal dielectric (IMD) layer 11, and a sacrifice layer 12 may be formed on the semiconductor substrate before the step of forming the mask layer 15. The etching stop layer 10 may be a single layer or a multiple layer structure. For example, the etching stop layer 10 may include a nitrogen doped carbide (NDC) layer and a tetraethylorthosilicate (TEOS) layer, but not limited thereto. The IMD layer 11 is formed on the etching stop layer 10. The IMD layer 11 may include an ultra-low dielectric constant (ULK) dielectric layer such as porous dielectric material, SiC, SiON, or combination thereof, but not limited thereto. The sacrifice layer 12 is formed on the IMD layer 11, and the mask layer 15 is formed on the sacrifice layer 12. The mask layer 15 may include a hard mask layer 13 and a cap layer 14. The cap layer 14 is formed on the hard mask layer 13. In this embodiment, the sacrifice layer 12 and the cap layer 14 may include silicon oxide, silicon carbide, silicon oxynitride (SiON), silicon oxycarbide (SiOC), or other suitable materials. The hard mask layer 13 may include a metal layer such as titanium nitride (TiN), a carbon containing material such as amorphous carbon, or other suitable hard mask materials.

A plurality of support features 20 is formed on the mask layer 15. The support features 20 are repeatedly disposed in a horizontal direction D2, and two adjacent support features 20 in the horizontal direction D2 are separated from each other by a gap. The support features 20 may be formed by the conventional photolithography process, but the present invention is not limited to this. In some embodiments of the present invention, the support features 20 may also be manufactured by other manufacturing processes such as the double patterning technology or the sidewall image transfer (SIT) technology according to different considerations. The support features 20 may be made of amorphous silicon, polysilicon, silicon oxide, silicon nitride, carbon, or appropriate materials.

Figure 5:
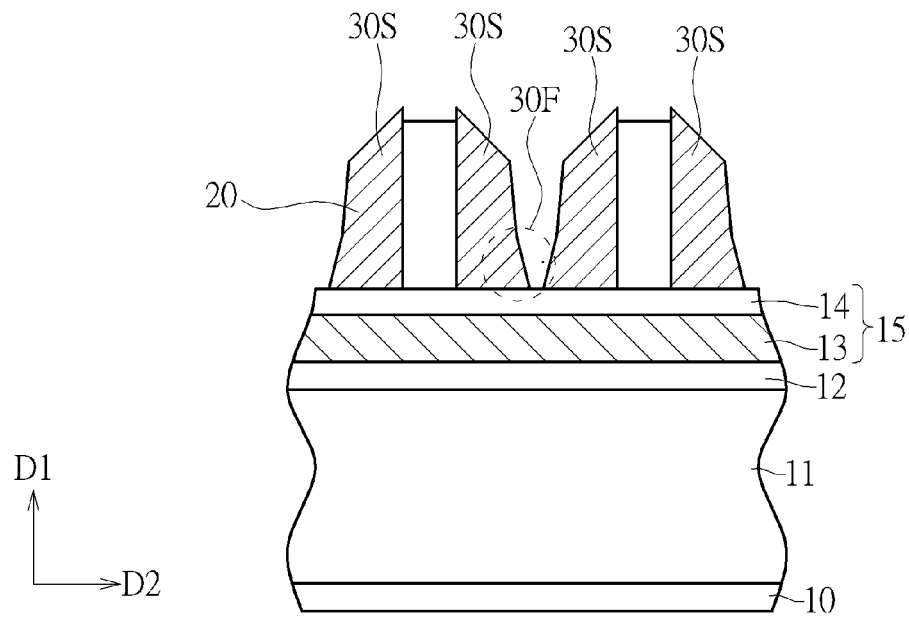

As shown in FIG. 4 and FIG. 5, a plurality of spacers 30S is formed on side walls of the support features 20. The spacers 30S in this embodiment may be formed by but not limited to the following steps. A spacer material layer 30 is formed conformally on the support features 20 and the exposed surface of the mask layer 15. The spacer material layer 30 may include any material that can act as a mask for transferring a pattern to the underlying mask layer 15. The spacer material layer 30 should be deposited with good step coverage, should be deposited at a temperature compatible with the mask layer 15 and the support features 20, and may be capable of being selectively etched relative to the mask layer 15 and the support features 20, but not limited thereto. For example, the spacer material layer 30 may include titanium oxide ($TiO_x$), tetraethoxy silane (TEOS), or other suitable materials such as polymer materials, but not limited thereto. In this embodiment, the spacer material layer 30 may be formed by appropriate manufacturing methods such as chemical vapor deposition (CVD), and the thickness of the spacer material layer 30 may be controlled to be substantially equal to the width of the support feature 20, but not limited thereto. The spacer material layer 30 is then subjected to a spacer etching process for removing a part of the spacer material layer 30 and forming the spacers 30S on the side walls of the support features 20. The spacer etching process may include an anisotropic etching preferably. As shown in FIG. 5, each of the spacers 30S may include a tapered part 30F extending in a direction away from the support feature 20 where the spacer 30S is formed. The tapered part 30F of the spacer 30S may also be regarded as a footing part directly contacting the mask layer 15 and will be formed especially when the distance between two adjacent support features 20 is extremely small and/or the over etching time in the spacer etching process is not enough. The tapered parts 30F of the spacers 30S will influence the critical dimension (CD) of subsequently formed patterned mask layer, the CD uniformity may be affected accordingly. The tapered part 30F may be removed by increasing the over etching time in the spacer etching process. However, the shoulder loss of the spacers 30S will increase and the mask layer 15 will be damaged by the spacer etching process when the over etching time increases, and it is not adequate to remove the tapered part 30F by just extending the over etch time in the spacer etching process.

Figure 6:
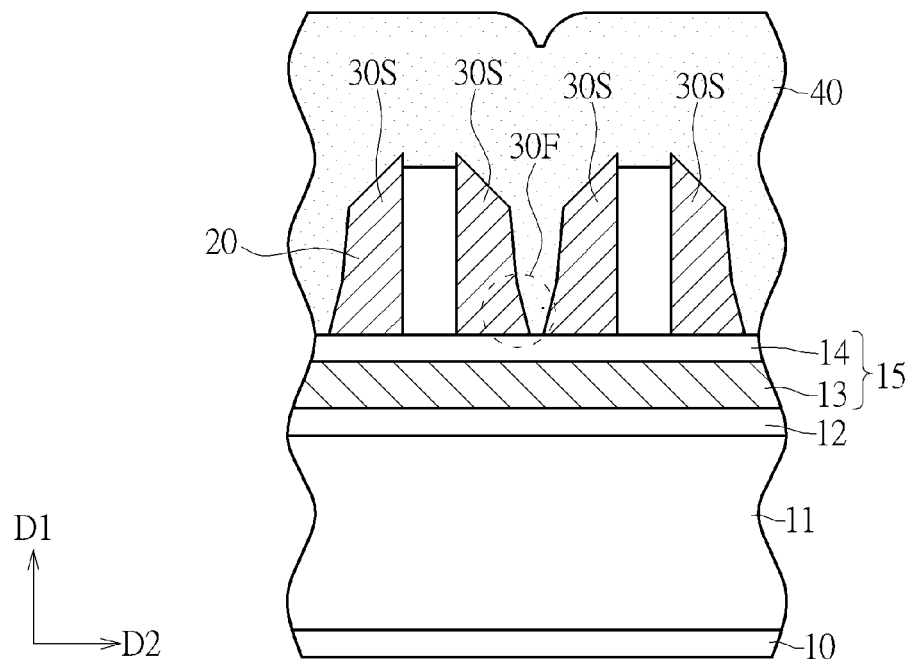
Figure 7:
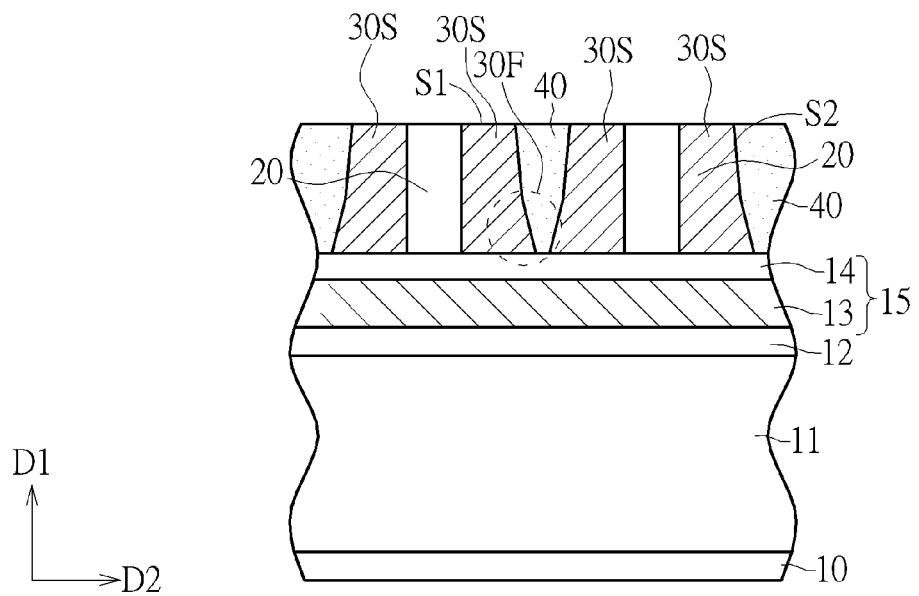

As shown in FIG. 6, a filling material layer 40 may be formed to cover the mask layer 15, the spacers 30S, and the support features 20. The filling material layer 40 may include a photoresist layer, such as a bottom anti-reflective coating (BARC), or other appropriate materials. Space between two adjacent spacers 30F is filled with the filling material layer 40. As shown in FIG. 6 and FIG. 7, a planarization process is then performed to remove an upper part of each of the spacers 30S and an upper part of each of the support features 20. Additionally, an upper part of the filling material layer 40 may also be removed by the planarization process. In other words, the filling material layer 40 is formed before the planarization process. In some embodiments of the present invention, the planarization process may include an etching back process with low etching selectivity between the spacers 30S and the support features 20, but the present invention is not limited to this. In some embodiments, the planarization process may include other processes, such as a chemical mechanical polishing (CMP) process. After the planarization process, the upper parts of the spacers 30S (may also be regarded as shoulder parts of the spacers 30S) may be removed, and the top surface S1 of the spacer 30S may be substantially coplanar with the top surface of the support feature 20.

Figure 8:
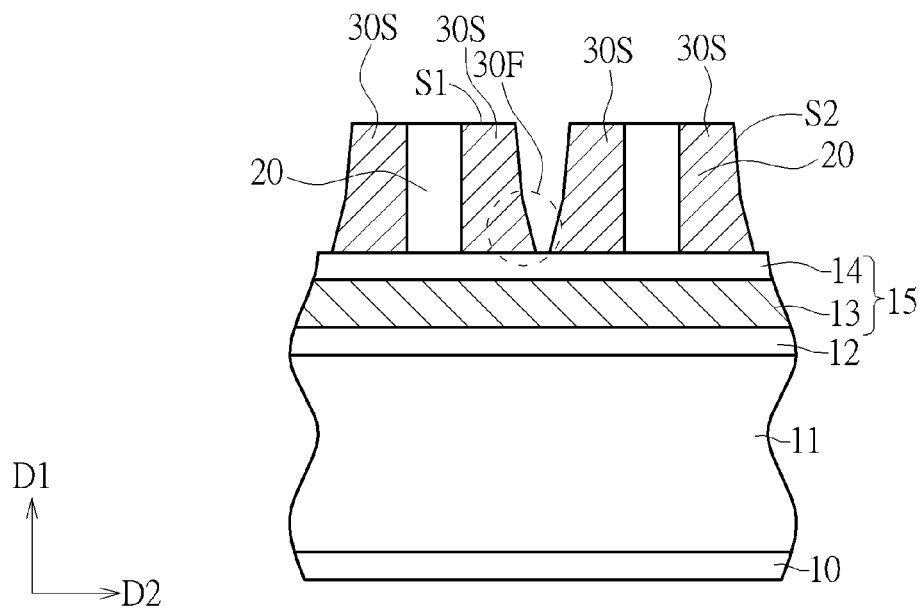

As shown in FIG. 7 and FIG. 8, after the planarization process, the filling material layer 40 remained between the spacers 30S is removed. The filling material layer 40 may be removed by an ashing process, a flushing process, or other appropriate processes.

Figure 9:
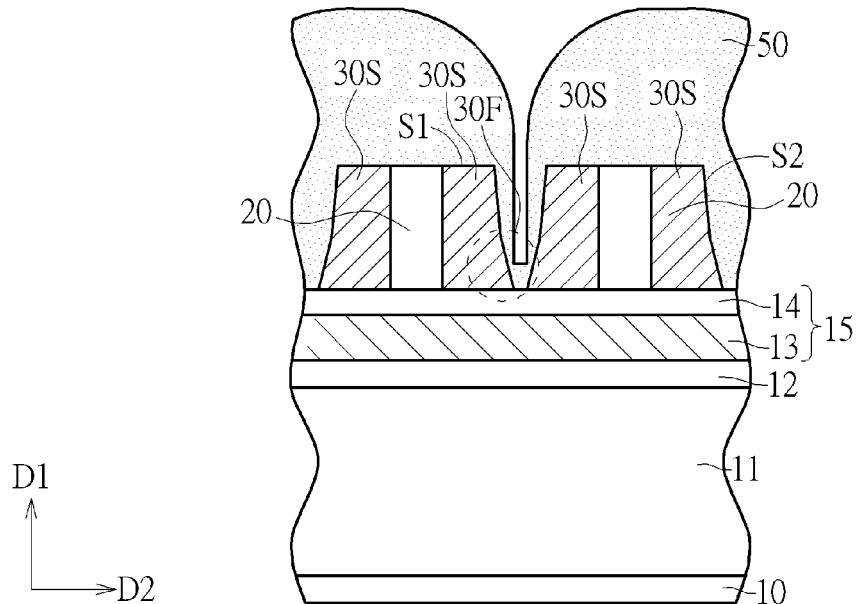
Figure 10:
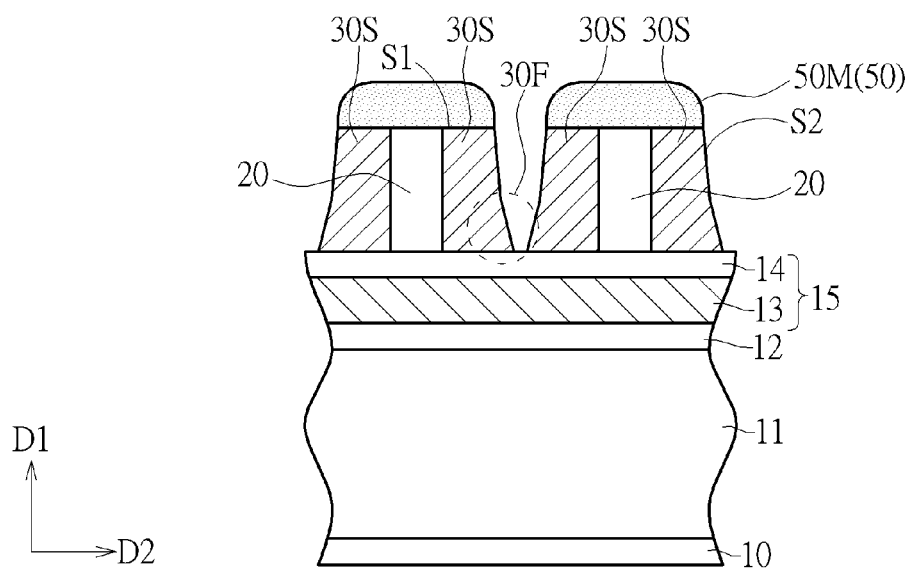

As shown in FIG. 9 and FIG. 10, a patterned protection layer 50M is then formed on the support features 20 and the top surfaces S1 of the spacers 30S. At least a part of side surfaces S2 of the spacers 30S are not covered by the patterned protection layer 50M. In other words, the planarization process mentioned above is performed before the step of forming the patterned protection layer 50M, the filling material layer mentioned above is removed before the step of forming the patterned protection layer 50M, and the upper parts of the spacers 30S are removed before the step of forming the patterned protection layer 50M. The patterned protection layer 50M directly covers the top surfaces S1 of the spacers 30S in a vertical direction D1 for protecting the spacers 30S except the taper parts 30F from the subsequent etching process.

The patterned protection layer 50M in this embodiment may be formed by but not limited to the following steps. As shown in FIG. 9, a protection layer 50 is formed to cover the spacers 30S, the support features 20 and the mask layer 15. A portion of the protection layer 50 may be formed between two adjacent spacers 30S. As shown in FIG. 9 and FIG. 10, an etching process is then performed to remove at least a part of the protection layer 50 between the two adjacent spacers 30S and expose at least a part of the side surfaces S2 of the spacers 30S, and the patterned protection layer 50M is formed by the etching process. The etching process for removing a part of the protection layer 50 may include an ashing process, a flushing process, or other appropriate etching processes. It is worth noting that the step of forming the protection layer 50 and the etching process for removing apart of the protection layer 50 may be performed in the same chamber, such as a chamber of a dry etching apparatus preferably for simplifying the processes and reducing influence during transportation between different process apparatuses, but the present invention is not limited to this. For example, the above mentioned processes may also be performed in different chambers of the same dry etching apparatus in some embodiments of the present invention. In this embodiment, the protection layer 50 may be formed in a chamber of a dry etching apparatus by introducing process gas such as methane ($CH_4$) or methyl fluoride ($CH_3F$) into the chamber without applying bias power. In other words, the patterned protection layer 50M may be formed in a process environment containing methane, and the patterned protection layer 50M may include a polymer layer containing methane.

Figure 11:
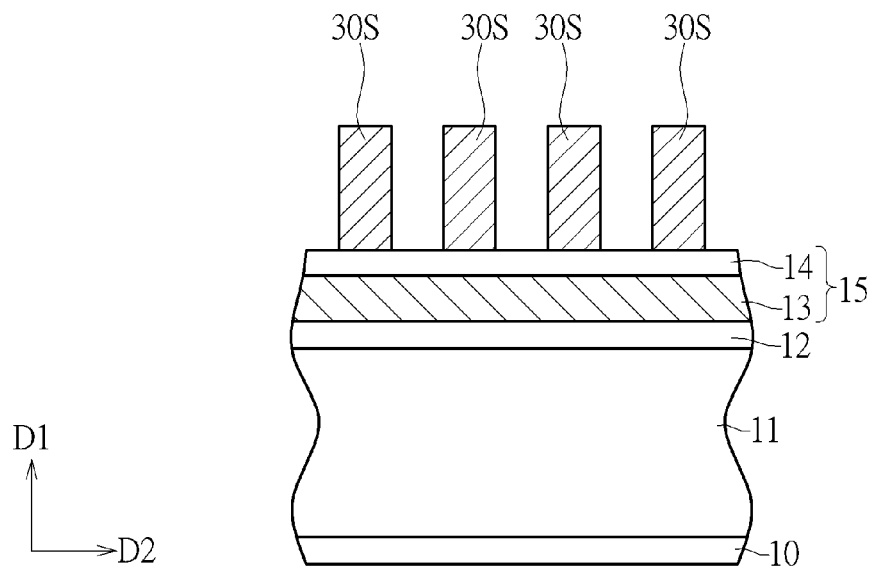

As shown in FIG. 10 and FIG. 11, a trimming process is then performed to remove a part of each of the spacers 30S. Specifically, the taper part 30F of each of the spacers 30S is not covered by the patterned protection layer 50M before the trimming process, and the taper parts 30F are removed by the trimming process. The trimming process may include a dry etching process using process gas such as chlorine ($Cl_2$) or other appropriate gas. In some embodiments, the patterned protection layer 50M may be also removed by the trimming process, and the support features 20 are exposed after the trimming process. In some embodiments, the patterned protection layer 50M may be removed by other process separately. After the trimming process, the support features 20 are removed for exposing a part of the mask layer 15. It is worth noting that the planarization process mentioned above, the process of removing the filling material layer remained between the spacers 30S, the process of forming the protection layer 50, the etching process for removing a part of the protection layer 50, the trimming process mentioned above, and the process of removing the support features 20 may be performed successively in the same chamber, such as a chamber of a dry etching apparatus preferably, but not limited thereto. In some embodiments, the above mentioned processes may also be performed in different chambers of the same dry etching apparatus or be performed in different apparatuses.

Figure 12:
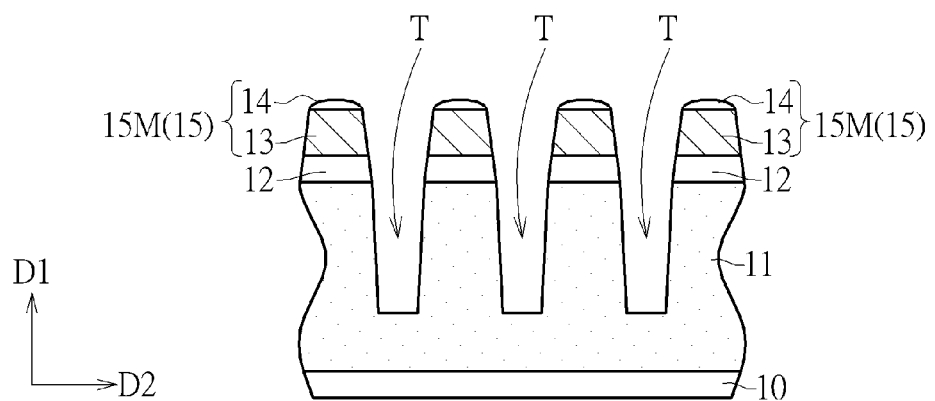

As shown in FIGS. 10-12, a mask etching process is then performed to remove the exposed part of the mask layer 15 by using the spacers 30S as a mask after the trimming process and the step of removing the support features 20, and a patterned mask layer 15M may be formed accordingly. The spacers 30S may be removed after the mask etching process. In the method of forming the patterned mask layer 15M of the present invention, the taper parts 30F of the spacers 30S are removed by the trimming process using the patterned protection layer 50M as a mask before the mask etching process, and the CD uniformity of the patterned mask layer 15M may be improved accordingly.

As shown in FIG. 12, the method in this embodiment may further include another etching process toward the sacrifice layer 12 and the IMD layer 11 by using the patterned mask layer 15M as a mask for forming a plurality of trenches T in the IMD layer 11. The trenches T may be filled with conductive materials such as copper (Cu), tungsten (W), or aluminum (Al) so as to form conductive lines (not shown), but not limited thereto. It is worth noting that the planarization process mentioned above, the process of removing the filling material layer remained between the spacers, the process of forming the protection layer, the etching process for removing a part of the protection layer, the trimming process mentioned above, the process of removing the support features, the mask etching process, and the etching process for forming the trenches T may be performed successively in the same chamber, such as a chamber of a dry etching apparatus preferably, but not limited thereto. In some embodiments, the above mentioned processes may also be performed in different chambers of the same dry etching apparatus or be performed indifferent apparatuses. In addition, the CD uniformity and the depth uniformity of the trenches T may be improved because the sacrifice layer 12 and the IMD layer 11 may be kept from being damaged during the processes of forming the patterned mask layer 15 and the CD uniformity of the patterned mask layer 15 is improved by removing the taper parts of the spacers before the mask etching process.

To summarize the above descriptions, in method of forming the patterned mask layer of the present invention, a part of each of the spacers is removed by the trimming process with the patterned protection layer formed on the top surfaces of the spacers. The tapered parts of the spacers may be removed by the trimming process before the step of etching the mask layer with the spacers as a mask. The CD uniformity of the patterned mask layer may be improved. The CD uniformity and the depth uniformity of the trenches formed by the patterned mask layer may also be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a patterned mask layer, comprising:
   forming a plurality of support features on a mask layer;
   forming a plurality of spacers on side walls of the support features;
   forming a patterned protection layer on the support features and top surfaces of the spacers, wherein at least a part of side surfaces of the spacers are not covered by the patterned protection layer, and the patterned protection layer is formed in a process environment containing methane ($CH_4$); and
   performing a trimming process to remove a part of each of the spacers, wherein at least one of the spacers comprises a tapered part extending in a direction away from the support feature where the spacer is formed.

2. The method of claim 1, wherein the taper part is not covered by the patterned protection layer before the trimming process, and the taper part is removed by the trimming process.

3. The method of claim 1, wherein the step of forming the patterned protection layer comprises:
   forming a protection layer covering the spacers and the support features, wherein a portion of the protection layer is formed between two adjacent spacers; and
   performing an etching process to remove at least a part of the protection layer between the two adjacent spacers and expose at least a part of the side surfaces of the spacers, wherein the patterned protection layer is formed by the etching process.

4. The method of claim 3, wherein the etching process comprises an ashing process or a flushing process.

5. The method of claim 3, wherein the step of forming the protection layer and the etching process are performed in the same chamber.

6. The method of claim 1, further comprising:
performing a planarization process to remove an upper part of each of the spacers and an upper part of each of the support features before the step of forming the patterned protection layer.

7. The method of claim 6, wherein the planarization process comprises an etching back process with low etching selectivity between the spacers and the support features.

8. The method of claim 6, further comprising:
forming a filling material layer covering the mask layer, the spacers and the support features before the planarization process, wherein space between two adjacent spacers is filled with the filling material layer, and an upper part of the filling material layer is removed by the planarization process; and
removing the filling material layer between the spacers after the planarization process and before the step of forming the patterned protection layer.

9. The method of claim 8, wherein the filling material layer comprises a photoresist layer.

10. The method of claim 9, wherein the filling material layer is removed by an ashing process or a flushing process.

11. The method of claim 1, wherein the patterned protection layer is removed by the trimming process, and the support features are exposed after the trimming process.

12. The method of claim 11, further comprising:
removing the support features after the trimming process for exposing a part of the mask layer; and performing a mask etching process to remove the exposed part of the mask layer by using the spacers as a mask after the trimming process and the step of removing the support features.

13. The method of claim 1, wherein the step of forming the spacers comprises:
forming a spacer material layer conformally on the mask layer and the support features; and
performing an anisotropic etching process to remove a part of the spacer material layer, expose the support features, and form the spacers on the side walls of the support features.

14. The method of claim 13, wherein the spacer material layer comprises titanium oxide.

15. A method of forming a patterned mask layer, comprising:
forming a plurality of support features on a mask layer;
forming a plurality of spacers on side walls of the support features;
forming a patterned protection layer on the support features and top surfaces of the spacers, wherein at least a part of side surfaces of the spacers are not covered by the patterned protection layer, and the patterned protection layer is formed in a process environment containing methane ($CH_4$);
performing a trimming process to remove a part of each of the spacers, wherein the patterned protection layer is removed by the trimming process, and the support features are exposed after the trimming process;
removing the support features after the trimming process for exposing a part of the mask layer; and
performing a mask etching process to remove the exposed part of the mask layer by using the spacers as a mask after the trimming process and the step of removing the support features.

* * * * *